United States Patent
Leshnovolsky et al.

(10) Patent No.: US 6,850,083 B2
(45) Date of Patent: Feb. 1, 2005

(54) BURN IN BOARD HAVING A REMOTE CURRENT SENSOR

(75) Inventors: Hanan Leshnovolsky, Afula (IL); Low Kok Wah, Penang (MY)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/361,108

(22) Filed: Feb. 5, 2003

(65) Prior Publication Data

US 2004/0150418 A1 Aug. 5, 2004

(51) Int. Cl.$^7$ .............................................. G01R 31/02
(52) U.S. Cl. ................................. 324/760; 324/117 H
(58) Field of Search .............................. 324/760, 765, 324/158.1, 117 H, 117 R; 165/80.1, 80.3; 307/98; 361/785, 88, 90; 439/66–72

(56) References Cited

U.S. PATENT DOCUMENTS 4,211,934 A * 7/1980 Henle et al. ................... 307/98
5,659,245 A * 8/1997 Ping et al. ................ 324/158.1

* cited by examiner

*Primary Examiner*—Vinh P. Nguyen
(74) *Attorney, Agent, or Firm*—Blakely, Sokoloff, Taylor & Zafman LLP

(57) ABSTRACT

According to one aspect of the invention, a system for indirectly sensing and switching off current in a burn-in board is provided. The system includes a device for indirectly sensing the current, circuitry for setting a maximum current limit and a delay time, circuitry for shutting off the current when it reaches the maximum current limit, and devices for remotely switching the current off and resuming current flow.

18 Claims, 4 Drawing Sheets

BURN IN BOARD HAVING A REMOTE CURRENT SENSOR

BACKGROUND OF THE INVENTION

1). Field of the Invention

This invention relates generally to burn-in board testing and/or other testing boards of electronic devices, and more specifically, to an indirect fuse of such boards.

2). Discussion of Related Art

When fabrication of electronic devices, such as computer processors and memories, has been completed, the electronic devices are subjected to "burn-in" and electrical tests in order to identify and eliminate defective devices before shipment to customers. During testing, a number of these electronic devices, having identical electronic contact layouts, are placed on burn-in boards, and several burn-in boards are placed in a burn-in oven. Electrical signals are transmitted to and from the sockets to test the electronic devices while being heat-stressed in the oven.

Burn-in boards are designed with safety devices to prevent over-current conditions. These safety devices protect critical components by preventing fires and damage to the electronic devices being tested.

The most common safety devices are fuses, current limiting integrated circuits, and polymeric positive temperature coefficient devices. Fuses are consumable items that require inventory management and have a high maintenance cost. Each time a fuse blows, the entire burn-in board is disabled and must be taken out of service. Downtime interrupts production and affects throughput. Current limiting integrated circuits are expensive, sensitive to voltage fluctuations, and susceptible to system program interference. Polymeric positive temperature coefficient devices, in the quiescent state, exhibit a substantial leakage current and circuit resistance, have a maximum operating current of 10 amperes, and cannot operate in an ambient environment of above 100 degrees C.

BRIEF DESCRIPTION OF THE DRAWINGS

The invention is described by way of example with reference to the accompanying drawings, wherein.

DETAILED DESCRIPTION OF THE INVENTION

FIG. 1 to FIG. 4 of the accompanying drawings illustrate a system for indirectly sensing and switching off current in a burn-in board. The system includes a device for indirectly sensing the current, circuitry for setting a maximum current limit and a delay time, circuitry for shutting off the current when it reaches the maximum current limit, and devices for remotely switching the current off and resuming current flow.

Figure 1:
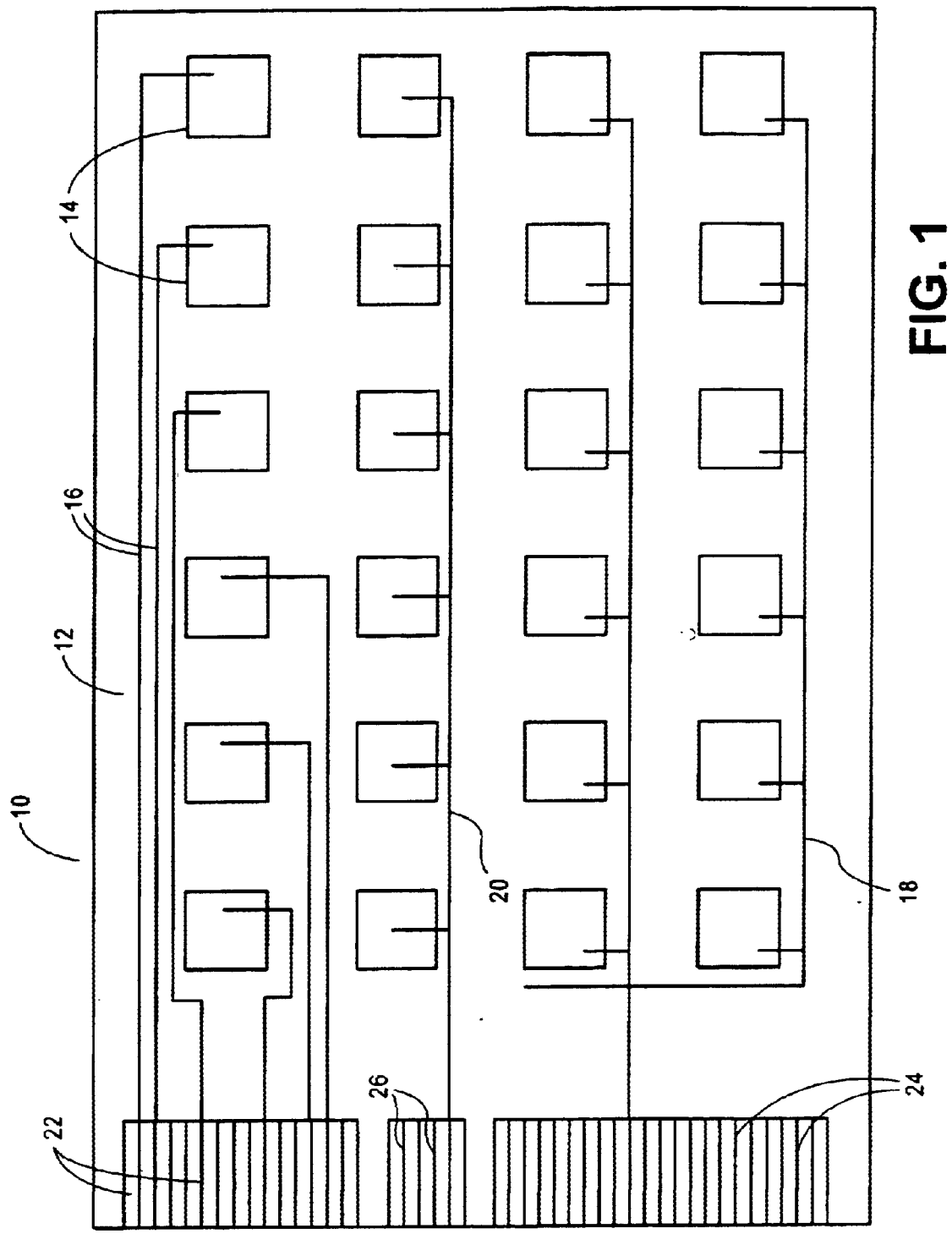
FIG. 1 is a top plan view illustrating a burn-in board with burn-in board sockets.

FIG. 1 illustrates a burn-in board (10). The burn-in board (10) includes a burn-in board substrate (12), 24 burn-in board sockets (14), each for receiving an electronic device, such as a microprocessor, power conductors (16), signal conductors (18), ground conductors (20), power connectors (22), signal connectors (24), and ground connectors (26).

Figure 2:
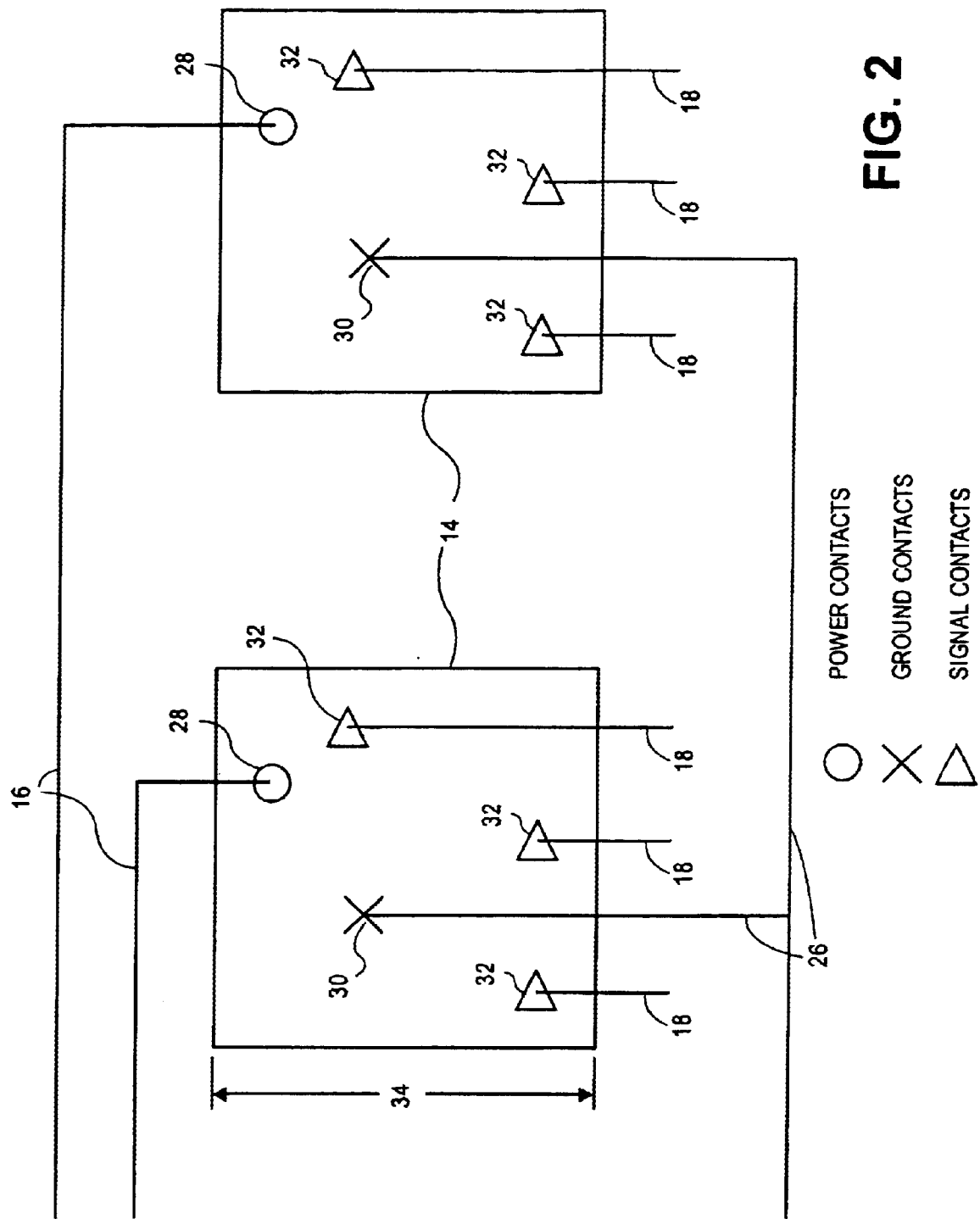
FIG. 2 is a top plan view illustrating two of the burn-in board sockets.

FIG. 2 illustrates two of the burn-in board sockets (14). Each socket includes one power contact (28), one ground contact (30) and three signal contacts (32). The burn-in board sockets (14) are square in shape with sides (34) of 2.5 cm. The power contacts (28), the ground contacts (30), and the signal contacts (32) lie in the burn-in board sockets (14) at the same locations. Each of the contacts (28, 30, 32) is connected to a respective power (16), signal (18), or ground (20) conductor.

Figure 3:
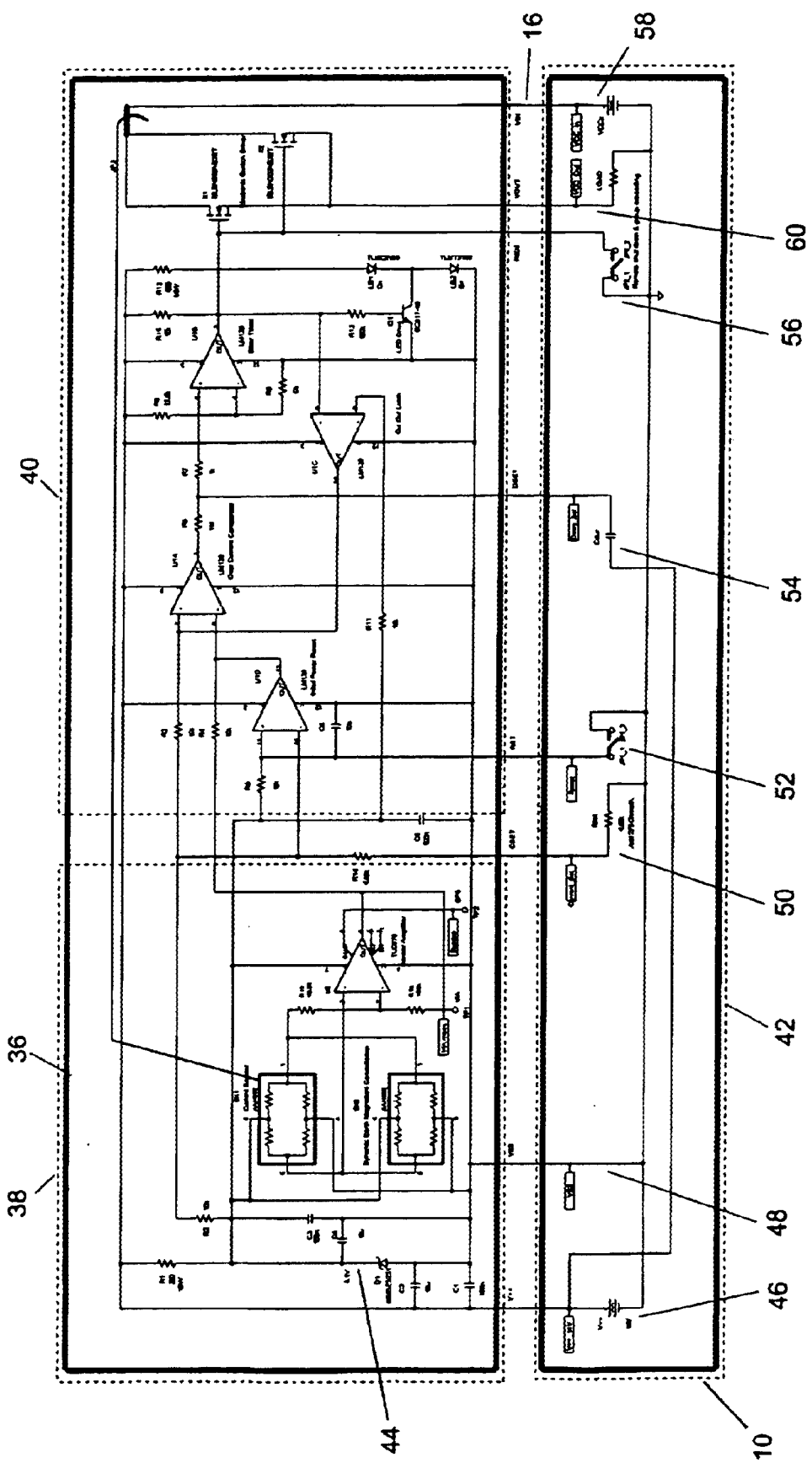
FIG. 3 is a schematic view illustrating part of the burn-in board including an indirect fuse.

FIG. 3 illustrates part of the burn-in board (10) including an indirect fuse (36) attached to the burn-in board substrate (12). The indirect fuse (36) includes current sensing circuitry (38) and power shut off circuitry (40). The burn-in board (10) includes burn-in board circuitry (42).

The current sensing circuitry (38) includes a current sensor (SN1), a Dynamic Earth Magnetism Cancellation ("DEMC") device (SN2), a sensor amplifier (U2), and a 5.1 V power source (44).

The current sensor (SN1) is a Giant Magneto Resistive device configured into a Wheatstone bridge. The current sensor (SN1) is used to sense current conducting to the sockets (14) through the power conductors (16). The current sensor (SN1) is very sensitive to a wide range of current by sensing the magnetic field around one of the power conductors (16) that is placed physically above or under the current sensor (SN1). The DEMC device (SN2) is also a Giant Magneto Resistive configured into a Wheatstone bridge. The current sensor (SN1) and the DEMC device (SN2) are connected in opposite polarity to the 5.1 V supply (44). The combined outputs of the current sensor (SN1) and the DEMC device (SN2) are connected to the sensor amplifier (U2).

The 5.1 V (44) is an internal step-down supply of the indirect fuse (36). The 5.1 V supply (44) is regulated using a Zener diode (D1). This voltage is needed only for the current sensing circuitry (38).

The sensor amplifier (U2) is programmed to a gain value of ×2 by two resistors (R15 and R16) at a negative input of the sensor amplifier (U2) in order to cover the needed sensed current range. The gain value of ×2 is calculated for a specific sensitivity range, but other gains can be calculated for other sensitivity ranges. When combined with the ×1 gain of a positive input, the overall sensor amplifier gain is ×3. An output signal of the sensor amplifier (U2) is connected to the power shut off circuitry (40) and to a test point (TP1) where a V/A signal can be measured for any kind of data acquisition. The sensor amplifier (U2) is also connected to the 5.1 V supply (44) and a manual bypass control (BPS).

The power shut off circuitry (40) includes an over current comparator (U1A), an initial power reset (U1D), a blow timer (U1B), a light emitting diode ("LED") driver (Q1) with two LEDs (LD1 and LD2), a cut out latch (U1C), and an electronic switch driver with two transistors (X1 and X2).

The over current comparator (U1A) is connected to the output of the sensor amplifier (U2), an output of the initial power reset (U1D), and the burn-in board circuitry (42). The output of the over current comparator (U1A) is connected to the blow timer (U1B). Two resistor (R6 and R7) are connected in series between the over current comparator (U1A) and the blow timer (U1B).

The blow timer (U1B) is connected to the output of the over current comparator (U1A) and the burn-in board circuitry (42). The output of the blow timer (U1B) is connected to the cut out latch (U1C), LED driver (Q1), burn-in board circuitry (42), and the electronic switch driver transistors (X1 and X2).

The cut out latch (U1C) is connected to the output of the blow timer (U1B). The output of the cut out latch (U1C) is connected back into the over current comparator (U1A).

The LED driver (Q1) is connected to the output of the blow timer (U1B). The LED driver (Q1) is connected to a "power on" LED indicator (LD1) and an "over current error" LED indicator (LD2).

The electronic switch driver transistors (X1 and X2) are two low resistance power Mosfet transistors each having a resistance of 3 mOhms for a total resistance of less than 2 mOhms. The electronic switch driver transistors (X1 and X2) are connected to the burn-in board circuitry (42).

The indirect fuse (36) is connected to the burn-in board circuitry (42) by eight pins: V++, VSS, CSET, RST, DSET, REM, VOUT, and VIN.

The burn-in board circuitry includes a 14 V power supply (46), a common ground (48), current set circuitry (50), reset circuitry (52), delay set circuitry (54), remote shut down and group cascading circuitry (56), and a power input (58) and output (60) for the sockets (14).

The 14 V is supplied from the V++ pin of the burn-in board (10). The 14 V supply (46) is connected to the current sensing circuitry (38), the power shut off circuitry (40), and the burn-in board circuitry (42). The common ground (48) is the common ground of the 14 V supply (46) and power switched through the electronic switch driver transistors (X1 and X2). The current set circuitry (50). includes a calculated resistor (Rset) which is connected to the indirect fuse (36) through the CSET pin to the initial power reset (U1D) and the over-current comparator (U1A). The reset circuitry (52) includes a mechanical switch and is connected to the initial power reset (U1D) though the RST pin. The delay set circuitry (54) includes a capacitor (Cdur) which is connected to a mid node of the two resistors (R6 and R7) through the DSET pin. The remote shutdown and group cascading circuitry (56) is a bi-directional signal switch which may be mechanical or an open collector NPN transistor and is connected to the output of the blow timer (U1B) through the REM pin and may be connected in parallel with similar signals of other indirect fuses (36) on the burn-in board (10).

Figure 4:
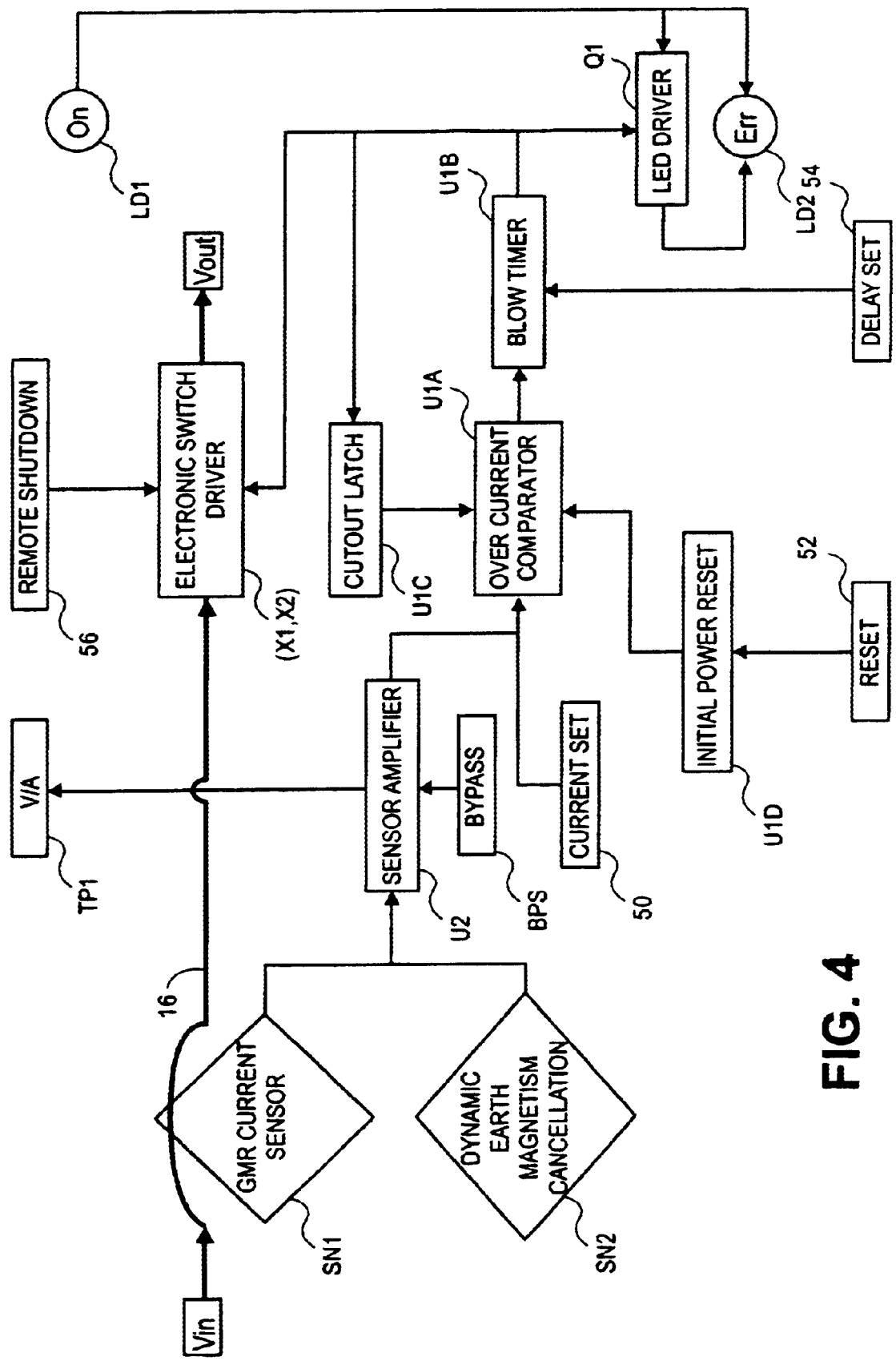
FIG. 4 is a block diagram illustrating the exchange of signals among the components of the indirect fuse and the burn-in board.

FIG. 4 illustrates the exchange of signals between the different components of the indirect fuse (36) and the burn-in board circuitry (42).

In use, current is conducted to the sockets (14) on the burn-in board (10) through the power conductor (16) and the electronic switch driver transistors (X1 and X2). The current sensor (SN1) is located such that it can detect the amount of current by sensing the strength of the magnetic field (electromagnetic field) created by the current. As the current in the power conductor (16) increases, the flux density of the magnetic field the current creates increases. The current sensor (SN1) sends a signal to the sensor amplifier (U2) along with a signal from the DEMC device (SN2).

When an ambient magnetic field, caused by the earth for example, affects the indirect fuse (36), that field affects both the current sensor (SN1) and the DEMC device (SN2) the same amount. Because the current sensor (SN1) and the DEMC device (SN2) are-connected to the 5.1 V supply (44) in opposite polarities, the outputs of the current sensor (SN1) and the DEMC device (SN2) will have the same absolute values, one will be positive and one will be negative, and the one will thus cancel the other out.

The current sensor (SN1) also detects the magnetic field due to the current conducting to the sockets (14). When the output signals from the current sensor (SN1) and the DEMC device (SN2) are combined, the outputs due to the ambient magnetic field cancel each other out, and only the output caused by the magnetic field due to the current conducting to the sockets (14) is sent to the sensor amplifier (U2). Since this method of detecting current does not involve any physical contact with the power conductors (16), there is no voltage drop across a resistor.

The sensor amplifier (U2) provides two output signals. A V/A signal is sent off of the indirect fuse (36) to the test point (TP1) for data acquisition purposes and a sensed current signal is sent to the over current comparator (U1A).

The over current comparator (U1A) compares the sensed current to the current level preset signal sent from the current set circuitry (50). The current preset signal can be set by changing the value of the calculated resistor (Rset) in the burn-in board (10) or by a programmed proportional voltage that is delivered to the CSET pin. The current preset signal is typically set between 100 mA and 45 A, but it can be set to currents below 100 mA and above 45 A.

In the event that the current exceeds the preset current level, the over current comparator (U1A) sends a signal to the blow timer (U1B). The blow timer (U1B) will respond after an amount of time equivalent to the delay time set by the delay set circuitry (54). The capacitor (Cdur) is-calculated to a value as required to obtain the desired delay time. The delay time typically ranges between 1 ms to 10 s, however, it can be set above 10 s. After the delay set time has passed, the blow timer (U1B) sends its output signal to the electronic switch driver transistors (X1 and X2), the cutout latch (U1C), and the LED driver (Q1).

The electronic switch driver transistors (X1 and X2) cut the power being supplied to the sockets and disable the load. The cutout latch (U1C) latches the over current comparator (U1A) until a reset is performed. The LED driver (Q1), which normally lights up the "power on" LED indicator (LD1), lights up the "over current error" LED indicator (LD2) to inform the user than an over current event has occurred and the current has been shut off.

If the indirect fuse (36) is connected in parallel to other indirect fuses through the remote shut down and group cascading circuitry (56), when an over current event triggers one of the indirect fuses to switch off its current, all of the indirect fuses will also switch their respective currents off.

Once the current has been switched off by the indirect fuse (36), the user can reset the indirect fuse (36) by completely shutting off all power supplied to it using the reset circuitry (52) or shorting to the ground (48) through the reset switch (52). Additionally, the user can turn off the current sensing feature of the indirect fuse (36) by using the bypass (BPS).

One advantage of this system is that the indirect fuse is a resettable circuit that can be used repeatedly. Another advantage of this system is the wide range of currents and delay time for which the indirect fuse can be set. A further advantage is that the indirect fuse can be used at high temperatures of up to 125 degrees Celsius.

Other embodiments of this invention could use Hall Effect sensors or indium sensors to detect the current. Hall Effect sensors, however, are much to big to be incorporated on a burn-in board. The current can also be sensed as it conducts through the electronic device or as is conducts from the ground contact of the socket on the burn-in board.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A burn-in board assembly, comprising:
   a burn-in board substrate;
   at least one burn-in socket on the burn-in board substrate to receive a respective electronic device, the electronic device having at least one contact;
   at least one burn-in board connector secured to the burn-in board substrate to releasably mate with a respective surface of a respective system connector;
   at least one burn-in board conductor to provide current to the contact on the device, the burn-in board conductor connecting the burn-in board connector to the contact on the device;
   a sensor to remotely detect the current flowing to the contact on the device;
   a control device connected to the sensor; and
   a switch connectable in the conductor and being controlled by the control device to reduce the flow of current through the conductor when the current exceeds a predetermined limit.

2. The burn-in board assembly of claim 1, wherein the sensor remotely detects current flowing from the contact on the device.

3. The burn-in board assembly of claim 2, wherein the sensor remotely detects a flux density of a field created by the flowing current.

4. The burn-in board assembly of claim 3, wherein the switch is controlled by the control device to reduce the flow of current when the flux density exceeds a predetermined limit.

5. The burn-in board assembly of claim 4, wherein the field is magnetic.

6. The burn-in board assembly of claim 5, wherein the predetermined limit of the current is between 100 mA and 45 A.

7. The burn-in board assembly of claim 6, wherein the control device reduces the flow of current after the predetermined limit of current is sustained for a predetermined amount of time.

8. The burn-in board assembly of claim 7, wherein the predetermined amount of time is between 1 ms and 10 s.

9. The burn-in board assembly of claim 8, further comprising a reset switch connected to the switch to increase the flow of current after the flow of current has been reduced by the control device, the reset switch being controlled by a user.

10. An indirect fuse, comprising:
    a sensor to remotely detect current flowing in a conductor;
    a control device connected to the sensor; and
    a switch connectable in the conductor and being controlled by the control device to reduce the flow of current through the conductor when the current exceeds a predetermined limit.

11. The indirect fuse of claim 10, wherein the sensor remotely detects a flux density of an electromagnetic field created by the current flowing in the conductor.

12. The indirect fuse of claim 11, wherein the sensor comprises first and second Wheatstone bridges, the first Wheatstone bridge attached to a power supply in a first polarity, the second Wheatstone bridge attached to the power supply in a second polarity opposed to the first polarity, the first Wheatstone bridge to detect the flux density of the field created by the current flowing in the conductor and an ambient flux density, the second Wheatstone bridge to detect the ambient flux density.

13. The indirect fuse of claim 12, wherein the switch is controlled by the control device to reduce the flow of current through the conductor when the flux density exceeds a predetermined limit for a predetermined period of time, the predetermined limit being between 100 mA and 45 A, the predetermined period of time being between 1 ms and 10 s.

14. A burn-in board assembly, comprising:
    a burn-in board substrate;
    a plurality of burn-in board sockets on the burn-in board substrate, each to receive a respective electronic device, the electronic devices having signal contacts at the same locations on the devices, power contacts at the same locations on the devices, and ground contacts at the same locations on the devices;
    a plurality of burn-in board signal connectors secured to the burn-in board substrate, each burn-in board signal connector having a surface for releasably mating with a respective surface of a respective system signal connector;
    a plurality of burn-in board signal conductors connecting the burn-in board signal connectors to the signal contacts on the devices;
    a plurality of burn-in board power connectors secured to the burn-in board substrate, each burn-in board power connector having a surface for releasably mating with a respective surface of a respective system power connector;
    a plurality of burn-in board power conductors to provide current to the power contacts, the burn-in board power conductors connecting the burn-in board power connectors to the power contacts of the devices;
    a plurality of burn-in board ground connectors secured to the burn-in board substrate, each burn-in board ground connector having a surface for releasably mating with a respective surface of a respective system ground connector;
    a plurality of burn-in board ground conductors through which the current flows from the ground contacts, the burn-in board ground conductors connecting the burn-in board ground connectors to the ground contacts on the devices;
    a sensor to remotely detect current flowing to the power contacts;
    a control device connected to the sensor; and
    a switch connectable in the power conductors and being controlled by the control device to reduce the flow of current through the power conductors when the current exceeds a predetermined limit.

15. The burn-in board assembly of claim 14, further comprising a plurality of the sensors to remotely detect the current flowing to a respective power contact on each of the devices, a plurality of the control devices connected to the sensors, and a plurality of the switches connectable in the power conductors and being controlled by the control devices to reduce the flow of current through the power conductors when the current flowing to the respective contact exceeds a predetermined limit.

16. The burn-in board assembly of claim 15, wherein the switches are connected such that when one of the switches reduces the flow of current to one of the power contacts, the remaining switches automatically reduce the flow of current to the remaining power contacts.

17. The burn-in board assembly of claim 16, wherein the sensors remotely detect current flowing from the ground contacts on the devices.

18. The burn-in board assembly of claim 16, further comprising a reset switch connected to the switches to increase the flow of current after the flow of current has been reduced by the control devices, the reset switch being controlled remotely by a user.

* * * * *